United States Patent
Wang et al.

(10) Patent No.: US 6,200,897 B1
(45) Date of Patent: Mar. 13, 2001

(54) METHOD FOR MANUFACTURING EVEN DIELECTRIC LAYER

(75) Inventors: Brian Wang, Taoyuan Hsien; Chih-Ching Hsu, Hsinchu, both of (TW)

(73) Assignees: United Semiconductor Corp.; United Microelectronics Corp., both of Hsinchu (TW)

( * ) Notice: Subject to any disclaimer, the term of this patent is extended or adjusted under 35 U.S.C. 154(b) by 0 days.

(21) Appl. No.: 09/328,977

(22) Filed: Jun. 6, 1999

(51) Int. Cl.[7] .................................................. H01L 21/00
(52) U.S. Cl. .............................. 438/692; 216/38; 216/88; 438/745; 438/756
(58) Field of Search .................................. 216/38, 88, 89, 216/93; 438/691, 692, 693, 745, 756, 757

(56) References Cited

U.S. PATENT DOCUMENTS

| | | | |
|---|---|---|---|
| 5,449,314 | * 9/1995 | Meikle et al. | 438/692 |
| 5,502,007 | * 3/1996 | Murase | 438/692 X |
| 5,516,729 | * 5/1996 | Dawson et al. | 438/693 X |
| 5,560,802 | * 10/1996 | Chisholm | 438/692 |

* cited by examiner

*Primary Examiner*—William Powell
(74) *Attorney, Agent, or Firm*—Jiawei Huang; J C Patents

(57) ABSTRACT

A method for manufacturing an even dielectric layer. A substrate having a patterned conductive layer formed thereon is provided. A first dielectric layer with a relatively high dopant dosage is formed on the substrate and the patterned conductive layer. A second dielectric layer with a relatively low dopant dosage is formed on the first dielectric layer. A chemical-mechanical polishing process is formed.

11 Claims, 2 Drawing Sheets

METHOD FOR MANUFACTURING EVEN DIELECTRIC LAYER

BACKGROUND OF THE INVENTION

1. Field of Invention

The present invention relates to a method for manufacturing a semiconductor device. More particularly, the present invention relates to a method for manufacturing an even dielectric layer over a relief surface.

2. Description of Related Art

Chemical-mechanical polishing (CMP) is currently the only process that can provide global planarization in very large scale integration (VLSI) and ultra-large scale integration (ULSI).

In the process of forming a dielectric layer, the dielectric layer possesses a relief surface due to the relief of the underlayer interconnect layer or the underlayer dielectric layer. After the CMP is performed, several recesses are formed in the dielectric layer with a depth about 2000 angstroms, which is called a dishing effect. Because of the dishing effect, the scumming effect will occur in the subsequently performed photolithography process or the bridging effect will occur in subsequently formed devices. Therefore, leakage and shorts occur and the electrical efficacy is decreased. To improve the dishing induced by CMP, many methods have been developed, such as reverse mask technique and dummy pattern technique. But these methods all require an increase in photolithography and etching steps. Hence, the cost is increased.

SUMMARY OF THE INVENTION

The invention provides an even dielectric layer. A substrate having a patterned conductive layer formed thereon is provided. A first dielectric layer with a relatively high dopant dosage is formed on the substrate and the patterned conductive layer. A second dielectric layer with a relatively low dopant dosage is formed on the first dielectric layer. A chemical-mechanical polishing process is formed.

The invention provides an even dielectric layer. A substrate having a patterned conductive layer formed thereon is provided. A gradient-doped dielectric layer is formed on the substrate and the patterned conductive layer. A chemical-mechanical polishing process is performed.

As embodied and broadly described herein, the invention provides a method for manufacturing an even dielectric layer. Since the polishing rate of the first dielectric layer is higher than that of the second dielectric layer, the recess due to the under layer patterned conductive layer gradually disappears during the CMP process. Hence, the problem caused by the dishing effect, the scumming effect and the bridging effect can be overcome.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
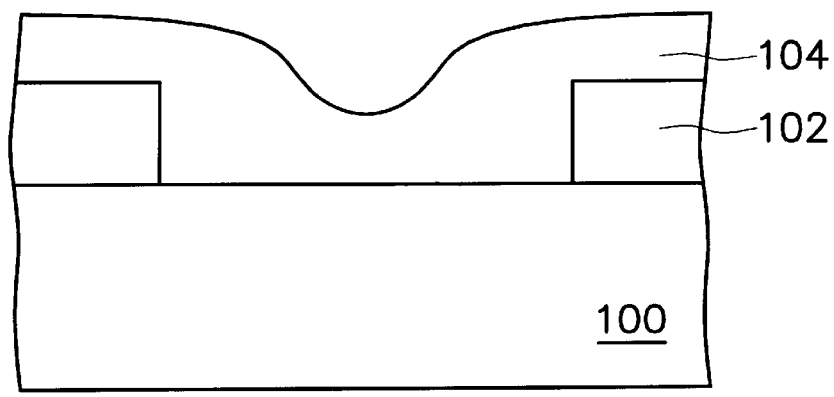
FIGS. 1A through 1C are schematic, cross-sectional views of the process for manufacturing an even dielectric layer in a preferred embodiment according to the invention.
Figure 1B:
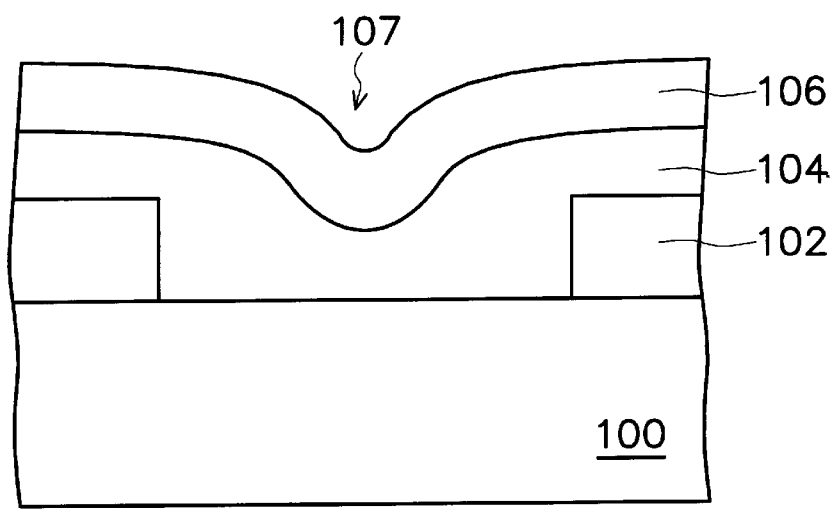
Figure 1C:
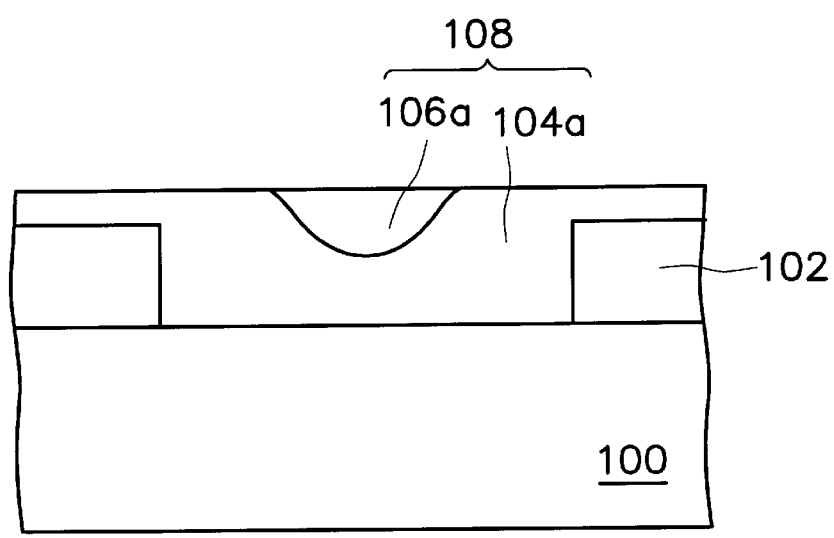
Figure 2:
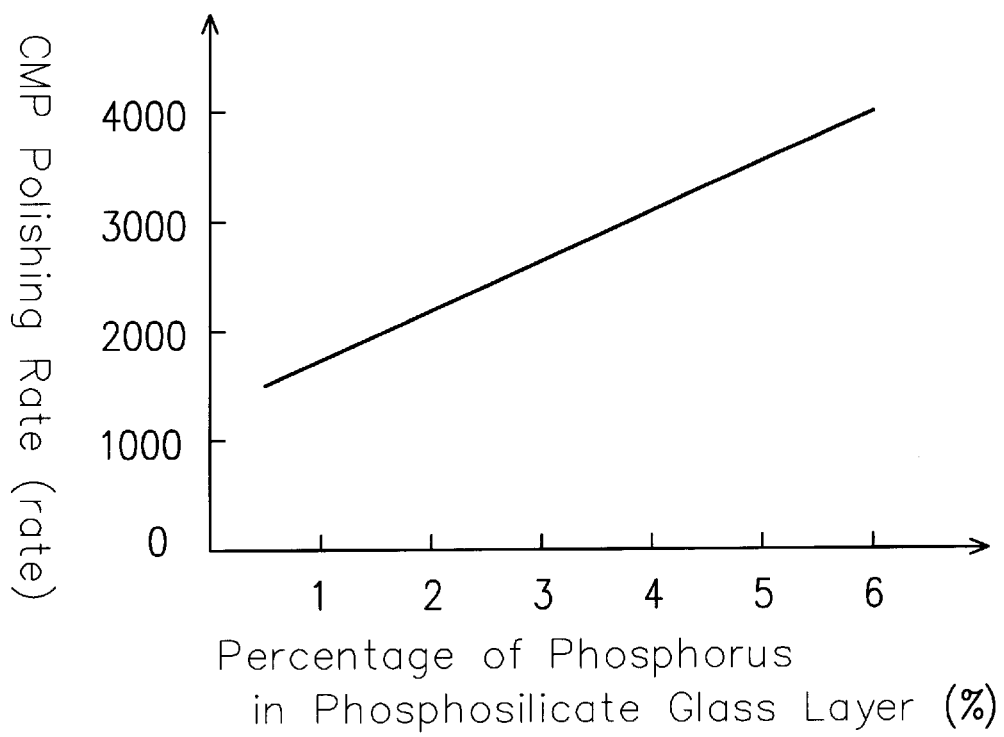
FIG. 2 is a plot of the chemical-mechanical polishing rate versus the percentage of phosphorus ions in the phosphosilicate glass.

FIGS. 1A through 1C are schematic, cross-sectional views of the process for manufacturing an even dielectric layer in a preferred embodiment according to the invention. FIG. 2 is a plot of the chemical-mechanical polishing rate versus the percentage of phosphorus ions in the phosphosilicate glass.

As shown in FIG. 1A, a substrate 100 having a patterned conductive layer 102 formed thereon and several semiconductor devices formed therein is provided. A dielectric layer 104 with a high dopant dosage is formed on the substrate 100 and on the patterned conductive layer 102. The dielectric layer 104 can be formed from borosilicate glass, phosphosilicate glass, borophosphosilicate glass or silicon oxide with metal dopants by chemical vapor deposition (CVD), for example. Due to a step height between the surface levels of the patterned conductive layer 102 and the substrate 100, the surface level of a portion of the dielectric layer 104 on the patterned conductive layer 102 is higher than that of another portion of the dielectric layer 104 on the substrate 100.

As shown in FIG. 1B, a dielectric layer 106 with a low dopant dosage is formed on the dielectric layer 104. The dielectric layer 106 can be formed from borosilicate glass, phosphosilicate glass, borophosphosilicate glass or silicon oxide with metal dopants by chemical vapor deposition (CVD), for example. The dopant dosage in the dielectric layer 106 is lower than that in the dielectric layer 104. Because of a relief surface of the dielectric layer 104, the surface level of a portion of the dielectric layer 106 above the patterned conductive layer 102 is higher than that of another portion of the dielectric layer 106 above the substrate 100 exposed by the patterned conductive layer 102. Therefore, a recess 107 is formed above the substrate 100 exposed by the patterned conductive layer 102.

As shown in FIG. 1C, a planarization process is performed to remove a portion of the dielectric layers 106 and 104 and to form a dielectric layer 108 with a substantially even surface. The dielectric layer 108 is constructed from dielectric layers 106a and 104a, wherein the dielectric layer 106a is located on the dielectric layer 104a above the substrate 100 exposed by the patterned conductive layer 102. Generally, it is well known that the CMP polishing rate varies with the dopant dosage in the dielectric layer. Taking phosphosilicate glass layer as an example, as shown in FIG. 2, the polishing rate of CMP performed on the phosphosilicate glass layer increases with the increasing phosphorus dosage in the phosphosilicate glass layer. Therefore, the polishing rate of the dielectric layer 104 with a relatively high dopant dosage is higher than that of the dielectric layer 106 with a relatively low dopant dosage. In this example, we assume that the material of the dielectric layers 104 and 106 are phosphosilicate glass. Since the surface level of the portion of the dielectric layer 106 above the patterned conductive layer 102 is relatively high, the polished amount of the portion of the dielectric layer 106 above the patterned conductive layer 102 is larger than that above the substrate 100 exposed by the patterned conductive layer 102.

When the portion of the dielectric layer 106 above the patterned conductive layer 102 is polished away and a portion of the dielectric layer 104 above the patterned conductive layer 102 is exposed, the remaining dielectric layer 106 is left on the dielectric layer 104 above the substrate 100 exposed by the patterned conductive layer 102. Moreover, the surface level of the remaining dielectric layer 106 is slightly lower than that of the portion of the dielectric layer 104 above the patterned conductive layer 102. Since the polishing rate of the dielectric layer 104 is higher than that of the dielectric layer 106, the polished amount of the portion of the dielectric layer 104 above the patterned conductive layer 102 is larger than that of the remaining dielectric layer 106 above the substrate 100 exposed by the patterned conductive layer 102. Throughout the CMP process, the depth of the recess 107 (as shown in FIG. 1B) is continuously decreased from about 2000 angstroms to about 500 angstroms until the surface level of the remaining dielectric layer 106 is equal to that of the portion of the dielectric layer 104 above the patterned conductive layer 102. After that, the dielectric layer 108 having a substantially even surface level and constructed by the dielectric layers 106a and 104a is formed. Because the polishing rate of the dielectric layer 106 is lower than that of the dielectric layer 104, the problems caused by the dishing effect, the scumming effect and the bridging effect can be overcome.

In the invention, the dielectric layer with an even surface level is constructed from one dielectric layer with a relatively high dopant dosage and one dielectric layer with a relatively low dopant dosage (such as the dielectric layers 104 and 106 shown in FIG. 1B) formed in sequence by multiple steps. In application, the dielectric layer can be a multi-layer dielectric layer, wherein the dopant dosage in the multi-layer dielectric layer is decreased from the bottom dielectric layer to the upper dielectric layer.

Figure 3:
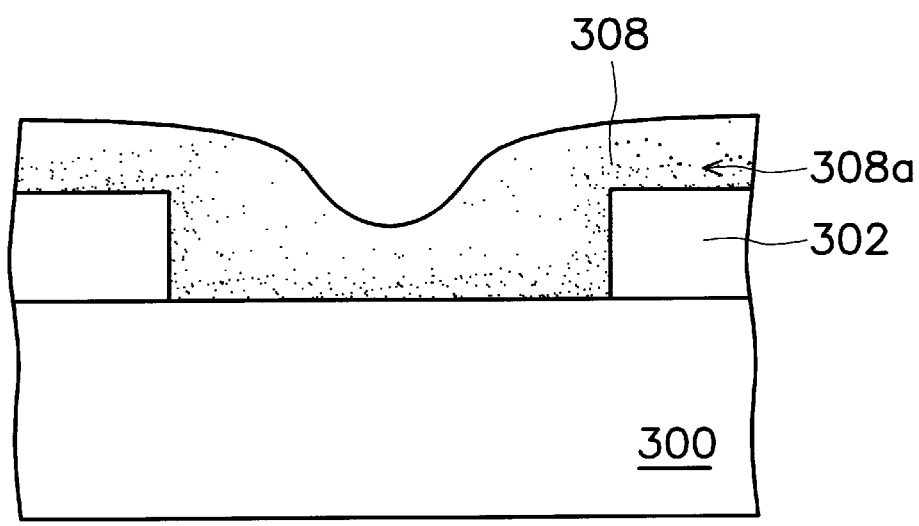
FIG. 3 is a schematic, cross-section view of a gradient-doped dielectric layer formed over a substrate having patterned conductive layer formed thereon according to one preferred embodiment of this invention.

Moreover, the dielectric layer also can be a gradient-doped layer. As shown in FIG. 3, the gradient-doped dielectric layer 308 is formed over the substrate 300. Dopants 308a in the gradient-doped dielectric layer 308 are in situ introduced during the formation of the gradient-doped dielectric layer 308, wherein the dopant dosage is decreased from the bottom of the gradient-doped dielectric layer 308 to the top of the gradient-doped dielectric layer 308.

Additionally, the dielectric layer also can be constructed from at least one dielectric layer with a relatively high polishing rate and at least one dielectric layer with a relatively low polishing rate.

Furthermore, in the invention, the formation of the even dielectric layer over the substrate having the patterned conductive layer is taken as an example. However, the method for manufacturing the even dielectric layer according to the invention can be also used to form a dielectric layer over a substrate having a patterned dielectric layer formed thereon.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an even dielectric layer formed over a substrate, the substrate having a patterned conductive layer formed thereon, comprising the steps of:
   forming a first dielectric layer with a relatively high dopant dosage on the substrate and the patterned conductive layer;
   forming a second dielectric layer with a relatively low dopant dosage on the first dielectric layer; and
   performing a chemical-mechanical polishing process.

2. The method of claim 1, wherein the step of forming the first dielectric layer includes chemical vapor deposition.

3. The method of claim 1, wherein the step of forming the second dielectric layer includes chemical vapor deposition.

4. The method of claim 1, wherein material of the first dielectric layer includes borosilicate glass.

5. The method of claim 1, wherein material of the first dielectric layer includes phosphosilicate glass.

6. The method of claim 1, wherein material of the first dielectric layer includes borophosphosilicate glass.

7. A method of manufacturing an even dielectric layer formed over a substrate, the substrate having a pattered conductive layer formed thereon, comprising the steps of:
   forming a gradient-doped dielectric layer, wherein the dopant dosage in the gradient-doped dielectric layer is increased with increasing depth, from the top of the gradient-doped dielectric layer to the bottom of the gradient-doped dielectric layer, on the substrate and the patterned conductive layer; and
   performing a chemical-mechanical polishing process.

8. The method of claim 7, wherein material of the gradient-doped dielectric layer includes borosilicate glass.

9. The method of claim 7, wherein material of the gradient-doped dielectric layer includes phosphosilicate glass.

10. The method of claim 7, wherein material of the gradient-doped dielectric layer includes borophosphosilicate glass.

11. A method of manufacturing an even dielectric layer formed over a substrate, the substrate having a patterned conductive layer formed thereon, comprising the steps of:
   forming a first dielectric layer with a relatively high polishing rate on the substrate and the patterned conductive layer;
   forming a second dielectric layer with a relatively low polishing rate on the first dielectric layer;
   performing a chemical-mechanical polishing process for removing a portion of said second dielectric layer with a relatively low polishing rate until a portion of said first dielectric layer with a relatively high polishing rate is exposed; and
   continuing said chemical-mechanical polishing process until reaching a planar endpoint to form an even surfaced dielectric layer.

* * * * *